(12) United States Patent
Akita

(10) Patent No.: US 8,350,740 B2  
(45) Date of Patent: Jan. 8, 2013

(54) A/D CONVERSION CIRCUIT AND RECEIVER

(75) Inventor: Ippei Akita, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 146 days.

(21) Appl. No.: 13/035,367

(22) Filed: Feb. 25, 2011

(65) Prior Publication Data

US 2012/0071122 A1    Mar. 22, 2012

(30) Foreign Application Priority Data

Sep. 16, 2010   (JP) .................................. 2010-208078

(51) Int. Cl.
*H03M 1/10* (2006.01)
*H03M 1/12* (2006.01)

(52) U.S. Cl. ......................................... 341/122; 341/155

(58) Field of Classification Search .................. 455/130, 455/190.1, 313, 323; 341/155, 122, 172
See application file for complete search history.

(56) References Cited

U.S. PATENT DOCUMENTS

| | | | |
|---|---|---|---|
| 4,196,419 A * | 4/1980 | Brown | 341/156 |
| 5,760,728 A * | 6/1998 | May et al. | 341/155 |
| 6,384,758 B1 * | 5/2002 | Michalski et al. | 341/122 |
| 6,867,724 B2 * | 3/2005 | Colonna et al. | 341/172 |
| 7,365,528 B2 * | 4/2008 | Kawamura | 324/131 |
| 7,564,394 B1 * | 7/2009 | Li | 341/155 |
| 2010/0151800 A1 * | 6/2010 | Akita et al. | 455/75 |
| 2012/0176263 A1 * | 7/2012 | Imai et al. | 341/144 |

OTHER PUBLICATIONS

Wei et al., "A Rapid Power-Switchable Track-and-Hold Amplifier in 90-nm CMOS, " IEEE Transactions on Circuits and Systems—II: Express Briefs, vol. 57, No. 1, pp. 16-20, (Jan. 2010).

\* cited by examiner

*Primary Examiner* — Sonny Trinh

(74) *Attorney, Agent, or Firm* — Finnegan, Henderson, Farabow, Garrett & Dunner, L.L.P.

(57) ABSTRACT

The A/D conversion circuit according to one aspect of the present invention includes: a first sampling capacitor; a first sampling switch; a buffer circuit; a second sampling capacitor; a second sampling switch; a first converter; a first reset switch; and a second reset switch. The first and second sampling switches are turned on to track voltage to the first sampling capacitor and to sample buffer voltage to the second sampling capacitor through the buffer circuit. The first sampling switch is turned off to hold voltage. The second sampling switch is turned off so that the first converter reads the voltage from the second sampling capacitor to perform A/D conversion thereon. After that, the first and second reset switches reset the first and second sampling capacitors.

16 Claims, 9 Drawing Sheets

A/D CONVERSION CIRCUIT AND RECEIVER

CROSS REFERENCE TO RELATED APPLICATIONS

This application is based upon and claims the benefit of priority from the prior Japanese Patent Application No. 2010-208078, filed on Sep. 16, 2010, the entire contents of which are incorporated herein by reference.

FIELD

The embodiments of the present invention relate to an A/D conversion circuit and a receiver using the same.

BACKGROUND

A track/hold circuit is used in the former stage of an analog/digital converter (hereinafter referred to as A/D converter) etc. to track and hold input analog voltage. Generally, such a track/hold circuit has a buffer circuit to drive an input capacitor of the A/D converter arranged in the latter stage. Particularly, this buffer circuit requires high bias current to secure sufficient track speed for high-speed operation, namely a sufficient band.

On the other hand, required is a high-speed track/hold circuit with low power consumption. It is known, as a structure of such a high-speed track/hold circuit with low power consumption, to provide a phase to reset the input terminal of the buffer before performing tracking process. By employing this structure, restrictions on the track speed depending on bias current can be removed.

However, in order to sufficiently reset output voltage in a limited reset phase period, bias current depending on the period is required in the above technique. That is, higher bias current is required as the period becomes shorter. Accordingly, there is a problem that power consumption cannot be reduced effectively.

DETAILED DESCRIPTION

Figure 1:
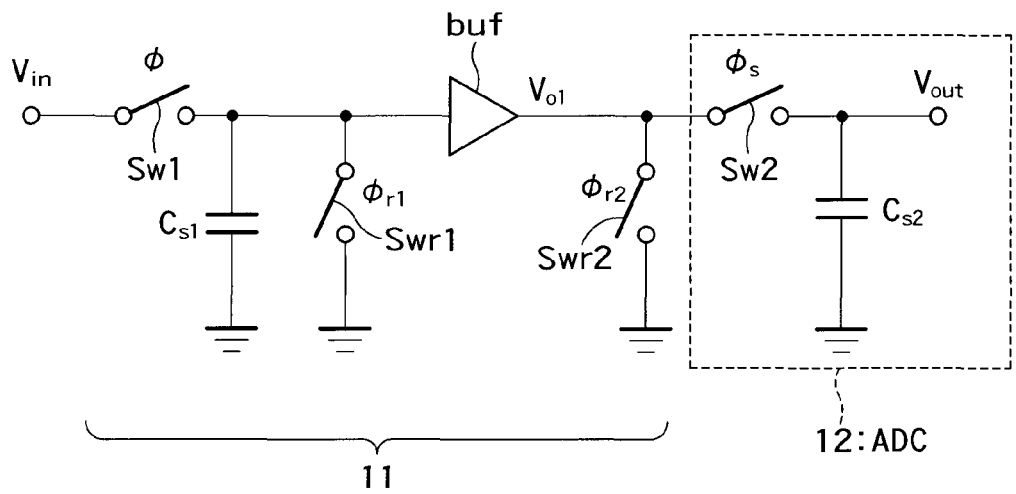
FIG. 1 is a diagram showing an A/D conversion circuit according to a first embodiment.

According to one embodiment, there is provided an A/D conversion circuit comprising: an input terminal, a first sampling capacitor, a first sampling switch, a buffer circuit, a second sampling capacitor, a second sampling switch, a first converter, a first reset switch and a second reset switch.

The input terminal is configured to receive an input analog voltage.

The first sampling capacitor is configured to have one end connected to a first power source.

The first sampling switch is configured to have one end electrically connected to the input terminal and an other end electrically connected to an other end of the first sampling capacitor. The first sampling switch controls connection and disconnection between the input terminal and the other end of the first sampling capacitor in accordance with a first sampling clock. The connection is performed to track the input analog voltage to the first sampling capacitor and the disconnection is performed to hold a voltage of the first sampling capacitor.

The buffer circuit is configured to have a buffer input terminal electrically connected to the other end of the first sampling capacitor and a buffer output terminal. The buffer circuit operating between the first power source and a second power source so that a track/hold voltage, which is the voltage of the first sampling capacitor, received by the buffer input terminal is buffered and outputted from the buffer output terminal.

The second sampling capacitor is configured to have one end connected to the first power source.

The second sampling switch is configured to have one end electrically connected to the buffer output terminal of the buffer circuit and an other end electrically connected to an other end of the second sampling capacitor. The second sampling switch controls connection and disconnection between the buffer output terminal and the other end of the second sampling capacitor in accordance with a second sampling clock. The connection is performed to sample a voltage of the buffer output terminal to the second sampling capacitor and the disconnection is performed to hold a voltage of the second sampling capacitor.

The first converter is configured to read a sample/hold voltage, which is the voltage of the second sampling capacitor after being held, and convert the sample/hold voltage into a digital signal.

The first reset switch is configured to reset the first sampling capacitor by short-circuiting the other end of the first sampling capacitor to the first power source or the second power source in a period after the voltage of the second sampling capacitor is held and before the connection is performed by the first sampling switch.

The second reset switch is configured to reset the second sampling capacitor by short-circuiting the other end of the second sampling capacitor to the first power source or the second power source in a period after the conversion by the first converter is performed and before the connection is performed by the first sampling switch.

Hereinafter, the embodiments of the present invention will be explained referring to the drawings.

(First Embodiment)

FIG. 1 shows an A/D (Analog/Digital) conversion circuit according to a first embodiment.

The A/D conversion circuit of FIG. 1 includes a track/hold (T/H) circuit 11 and an Analog-Digital (A/D) converter (ADC) 12.

The T/H circuit 11 includes: a Vin terminal; a sampling switch Sw1; a sampling capacitor Cs1; a reset switch Swr1; a buffer circuit buf; and a reset switch Swr2.

The ADC (A/D converter) 12 includes: a sampling switch Sw2; a sampling capacitor Cs2; a Vout terminal; and a converter (first converter) (see FIG. 3 explained later).

The Vin terminal is supplied with an analog voltage inputted from the outside (hereinafter referred to simply as input voltage.)

One end of the sampling capacitor (first sampling capacitor) Cs1 is connected to a ground. The ground in the present embodiment corresponds to a first power source.

One end of the sampling switch (first sampling switch) Sw1 is connected to the Vin terminal, and the other end of the sampling switch Sw1 is electrically connected to the other end of the sampling capacitor Cs1.

The sampling switch Sw1 is turned on and off depending on a sampling clock $\phi$ (first sampling clock) from a clock generator (not shown in the drawings). That is, the sampling switch Sw1 controls the connection and disconnection between the Vin terminal and the other end of the sampling capacitor Cs1. The connection is performed to track the input voltage to the sampling capacitor Cs1, and the disconnection is performed to hold the voltage of the sampling capacitor Cs1.

The reset switch (first reset switch) Swr1 is connected in parallel with the sampling capacitor Cs1. One end of the reset switch Swr1 is connected to the ground, and the other end thereof is electrically connected to the other end of the sampling capacitor Cs1.

The reset switch Swr1 is turned on/off depending on a clock (first reset clock) $\phi r1$ from a clock generator (not shown in the drawings.) When the reset switch Swr1 is turned on, the other end of the sampling capacitor Cs1 is short-circuited to the ground to reset the sampling capacitor Cs1, and when the reset switch Swr1 is turned off, the reset state is released.

The input terminal of the buffer circuit buf (buffer input terminal) is electrically connected to the other end of the sampling capacitor Cs1.

The buffer circuit buf operates between the ground and a power supply voltage Vdd (second power source) so that a track/hold voltage, which is the voltage of the sampling capacitor Cs1, received by the buffer input terminal is buffered and outputted from an output terminal (buffer output terminal) Vo1. That is, the buffer circuit buf holds (buffers) a voltage depending on the voltage of the sampling capacitor Cs1.

One end of the sampling capacitor (second sampling capacitor) Cs2 in the ADC 12 is connected to the ground.

One end of the sampling switch Sw2 is electrically connected to the buffer output terminal, and the other end of the sampling switch Sw2 is electrically connected to the other end of the sampling capacitor Cs2. The sampling switch Sw2 is turned on/off in accordance with a sampling clock $\phi s$ (second sampling clock). That is, the sampling switch Sw2 controls the connection and disconnection between the buffer output terminal and the other end of the sampling capacitor Cs2. The connection is performed to sample the voltage of the buffer output terminal to the sampling capacitor Cs2, and the disconnection is performed to hold the voltage of the sampling capacitor Cs2.

The converter in the ADC 12 (see FIG. 3) reads a sample/hold voltage, which is the voltage of the sampling capacitor Cs2 after being held, and converts the read sample/hold voltage into a digital signal.

One end of the reset switch Swr2 is connected to the ground, and the other end thereof is electrically connected to one end of the sampling switch Sw2. The reset switch Swr2 is a switch showing one characteristic of the present embodiment. The reset switch Swr2 is turned on/off depending on a clock (second reset clock) $\phi r2$ from a clock generator (not shown in the drawings). When both of the reset switch Swr1 and the sampling switch Sw2 are turned on, the other end of the sampling capacitor Cs2 is short-circuited to the ground to reset the sampling capacitor Cs2, and when both of them are turned off, the reset state is released.

The operation timing of the reset switch Swr2 is set so that the reset switch Swr2 resets the sampling capacitor Cs2 in a period after the ADC 12 performs the A/D conversion on the sample/hold voltage and before the sampling switch Sw1 performs the connection. Further, the reset switch Swr1 resets the sampling capacitor Cs1 in a period after at least the voltage of the sampling capacitor Cs2 is held and before the sampling switch Sw1 performs the connection.

Figure 2:
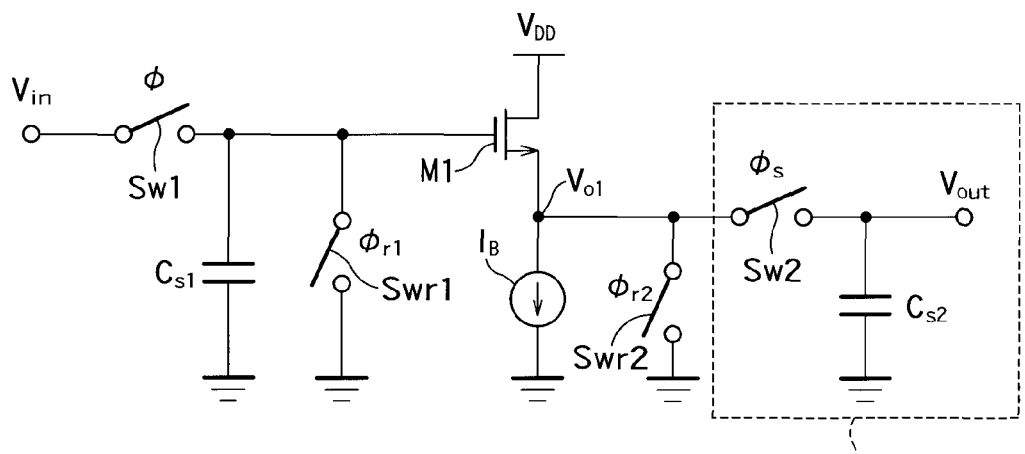
FIG. 2 is a diagram showing a concrete example of a buffer circuit in the A/D conversion circuit of FIG. 1.

FIG. 2 shows an example of the structure of the buffer circuit.

This buffer circuit functions as a source follower formed of a transistor M1 and a bias current source $I_B$. The transistor M1 is an NMOS transistor.

The drain of the transistor M1 is connected to the power supply voltage ($V_{DD}$), and the source of the transistor M1 is connected to the input of the current source $I_B$ and the buffer output terminal. The output of the current source $I_B$ is connected to the ground.

Figure 3:
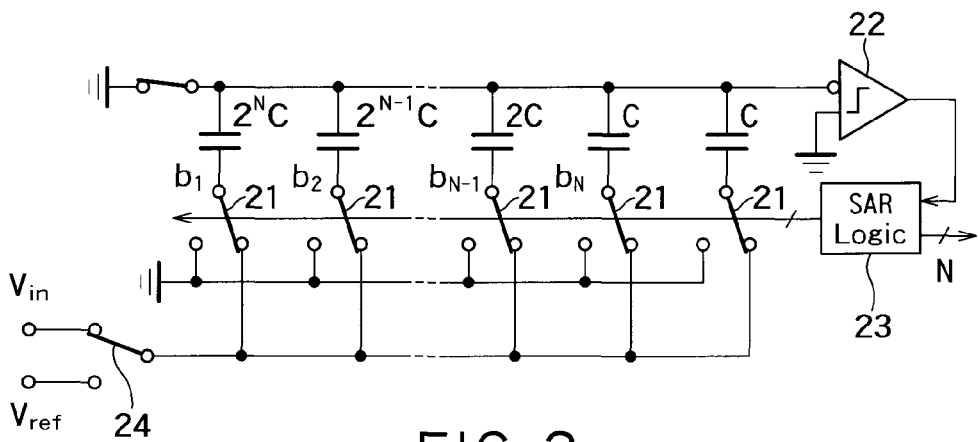
FIG. 3 is a diagram showing a concrete example of an A/D converter in the A/D conversion circuit.

FIG. 3 shows an example of the circuit structure of the ADC 12.

The structure of a successive approximation Register (SAR) type A/D converter is shown in FIG. 3 an example of the ADC.

The ADC is formed of: a plurality of weighted capacitors (C, C, 2C, ... $2^{N-1}C$, $2^{N}C$); a plurality of switches 21 and 24; a comparator 22; and an SAR logic 23. N shows the bit number of the digital signal, and the bit numbers are described as $b_1$ to $b_N$ in the order from the least significant bit.

FIG. 3 shows how the switches are connected in the sampling state of the ADC. When viewing from a Vin terminal (which is different from the Vin terminal of FIG. 1), the SAR (Successive Approximation Register) type A/D converter of FIG. 3 equivalently corresponds to the ADC 12 of FIG. 1. For example, the sampling switch Sw2 shown in FIG. 1 corresponds to an input unit switch 24 and a plurality of switches 21 connected in series therewith shown in FIG. 3, the sampling capacitor Cs2 shown in FIG. 1 corresponds to the total of a plurality of weighted capacities (C, C, 2C, ... $2^{N-1}C$, $2^{N}C$), the Vout terminal corresponds to the input terminal of the comparator 22, and the converter corresponds to the comparator 22 and the SAR logic 23.

Next, the operation of the A/D conversion circuit shown in FIG. 2 will be explained using FIG. 4.

Figure 4:
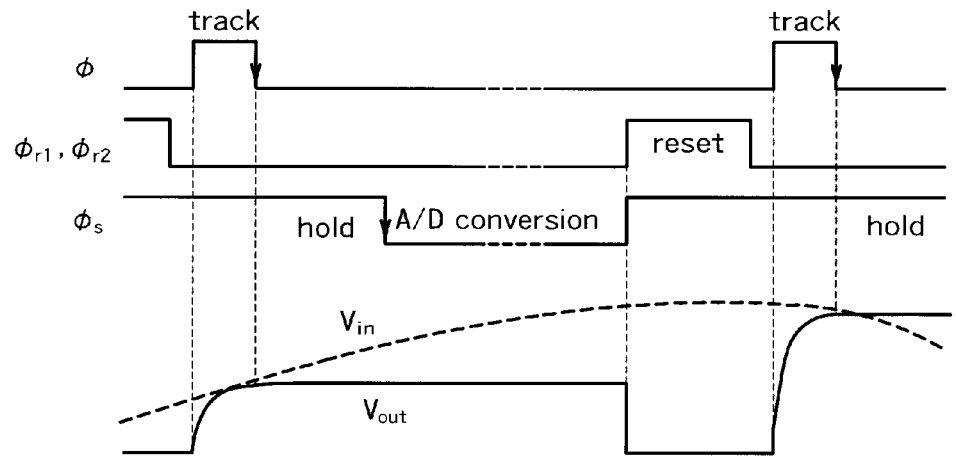
FIG. 4 is a diagram explaining the operation of the A/D conversion circuit of FIG. 1.

FIG. 4 shows on/off timing of each of the switches Sw1, Swr1, Swr2, and Sw2 of FIG. 2, the voltage of the Vin terminal, and a waveform of the voltage of the Vout terminal.

In this example, the reset switches Swr1 and Swr2 are controlled to be turned on/off with the same reset clock. That is, the reset clock $\phi r1$ for the reset switch Swr1 and the reset clock φr2 for the reset switch Swr2 are the same clock φr. Note that these reset switches are not necessarily required to be controlled with the same clock. These reset switches can be controlled with different clocks as long as the reset can be performed within an acceptable reset period. For example, the reset switch Swr1 may be reset earlier than the reset switch Swr2.

First, a track phase will be considered as a case where the sampling switch Sw1(φ) is turned on, the reset switches Swr1 (φr1) and Swr2(φr2) are turned off, and the sampling switch Sw2(φs) is turned on. At this time, output voltage Vout tracks input voltage Vin through the source follower.

Next, the sampling clock φ is set at low level to perform sampling on the sampling capacitors Cs1 and Cs2 and to retain the input voltage Vin at this timing (the voltage of the sampling capacitor Cs1 is held).

After that, the sampling clock φs is set at low level to disconnect the source follower from the ADC 12 and to hold the voltage of the sampling capacitor Cs2 so that analog-digital conversion (A/D conversion) is performed on the sample/hold voltage.

Then, in a period after the A/D conversion is performed and before the next tracking is performed, the reset clocks φr (φr1 and φr2) and the sampling clock φs are set at high level. That is, the reset switch Swr1 resets the gate voltage of the source follower M1 (the sampling capacitor Cs1 is reset), and the reset switch Swr2 resets the Vout terminal (the sampling capacitor Cs2 is reset).

In this way, charges of the sampling capacitor Cs2 are instantly extracted by the reset switch Swr2, and the output voltage Vout is reset (in other words, the charge amount of the sampling capacitor Cs2 becomes 0).

After that, the phase is shifted to a track phase as stated above, and the output voltage Vout starts tracking from the point of having the reset voltage (ground voltage, for example.)

As will be understood from the waveform of the voltage Vout in the reset period in FIG. 4, the sampling capacitor Cs2 is instantly reset by the reset switch Swr2 regardless of the value of the current source $I_B$.

Figure 5:
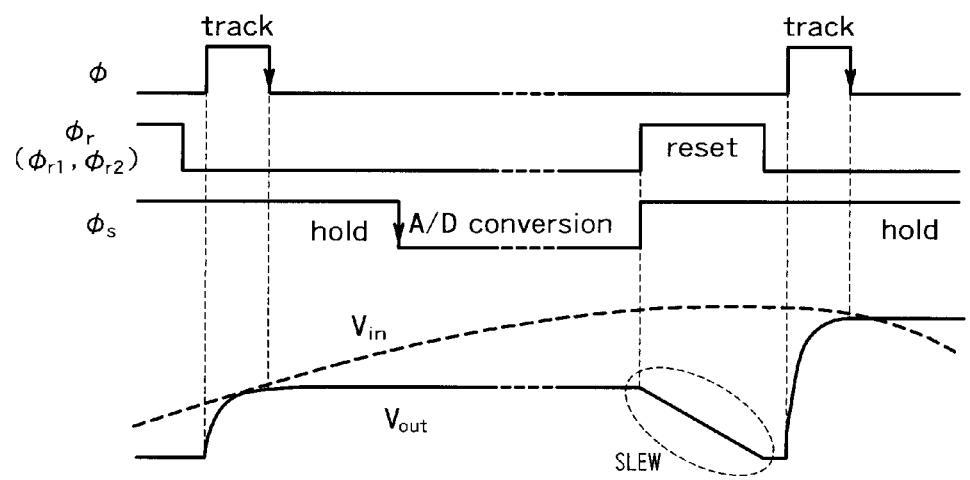
FIG. 5 is a diagram explaining the operation of a conventional A/D conversion circuit.

When the reset by the reset switch Swr2 is not performed (that is, when the switch Swr2 is not arranged), the reset should be performed only by the current source $I_B$. When the current source $I_B$ is made small in order to reduce power consumption, a long reset period (in which the reset clock is at High level) is required to entirely extract the charges of the sampling capacitor Cs2. Accordingly, as shown in FIG. 5, slew is caused in the voltage Vout. The extended reset period affects the track period, hold period, and A/D conversion period, by which high-speed operation is made difficult and a trade-off between speed and electric power is remarkably caused.

On the other hand, in the present embodiment, by arranging the reset switch Sw2, the sampling capacitor Cs2 is instantly reset by the switch Swr2 regardless of the value of the current source $I_B$. Accordingly, slew does not occur, restrictions on the current source $I_B$ or the reset period are removed, and trade-off between speed and electric power can be dramatically improved.

(Second Embodiment)

Figure 6:
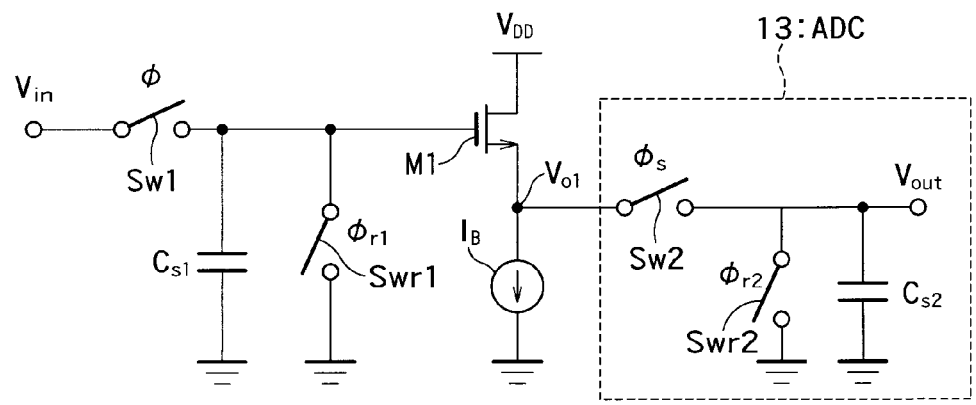
FIG. 6 is a diagram showing an A/D conversion circuit according to a second embodiment.

FIG. 6 shows an A/D conversion circuit according to a second embodiment.

In the structure shown in FIG. 6, the reset switch Swr2 of FIG. 2 is arranged in parallel with the sampling capacitor Cs2. That is, one end of the sampling switch Sw2 is connected to the source terminal (or buffer output terminal) of the source follower M1. Further, the other end of the sampling switch Sw2 is connected to the other end of the sampling capacitor Cs2. The other end of the reset switch Swr2 is connected to the other end of the sampling capacitor Cs2. The other components are structured similarly to those of FIG. 2.

The operation of the A/D conversion circuit of FIG. 6 will be explained using the timing chart of FIG. 7.

Figure 7:
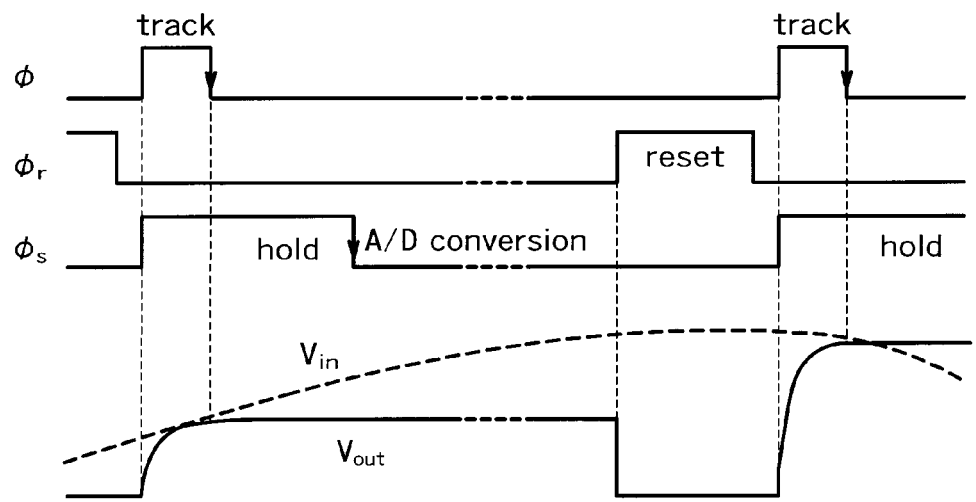
FIG. 7 is a diagram explaining the operation of the A/D conversion circuit of FIG. 6.

Similarly to FIG. 4, in the track phase of FIG. 7, the sampling switch Sw1(φ) is turned on, the reset switches Swr1 (φr1) and Swr2(φr2) are turned off, and the sampling switch Sw2(φs) is turned on. Further, sampling (hold) and A/D conversion are performed in a way similar to that explained in FIG. 4.

Note that the reset phase is a little bit different from that of FIG. 4. That is, in the present embodiment, the sampling clock φs is not required to be set at high level at the timing when the reset clocks φr (φr1 and φr2) are set at high level. Note that A/D conversion must be completed before the reset clocks φr are turned on (this is similarly applied to the first embodiment.)

As stated above, according to the present embodiment, the timing for turning on the sampling switch Sw2 can be delayed compared to the first embodiment. Further, a similar effect to the first embodiment can be obtained.

(Third Embodiment)

Figure 8:
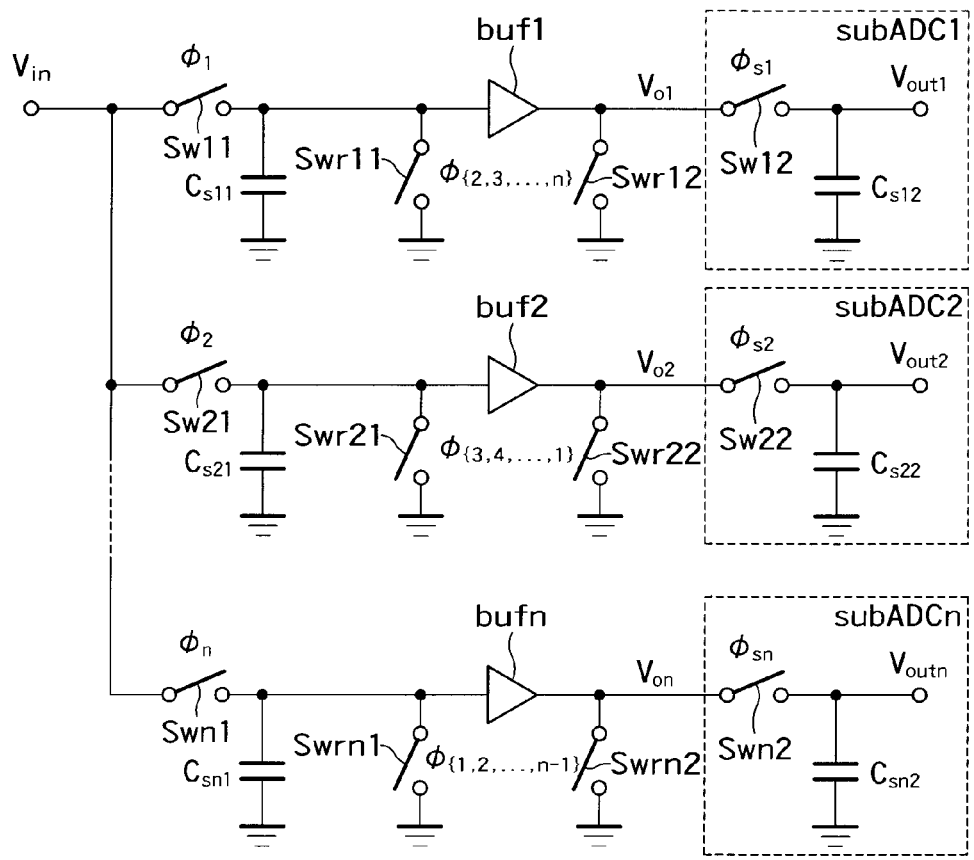
FIG. 8 is a diagram showing an A/D conversion circuit according to a third embodiment.

FIG. 8 shows an A/D conversion circuit according to a third embodiment.

In this A/D conversion circuit, a plurality of pairs each consisting of a T/H circuit and an A/D converter are arranged in parallel in n channels, the pairs being commonly connected to the input terminal Vin. By performing track/hold operation by the T/H circuit of each channel in a time-division way, high-speed operation can be realized. T/H circuits arranged in parallel to time-divisionally operate as stated above are called time-interleaved (TI) type T/H circuit.

As shown in FIG. 8, elements correspondingly arranged in each channel are identified by adding i having a value of 1 to n to the reference symbols used in FIG. 1. In FIG. 8, a plurality of (n) ADCs are arranged, and thus each ADC is referred to as sub-ADC. One end of a sampling switch Swi1 (i=1 to n) in each channel is commonly connected to the input terminal Vin.

Each of buffer circuits buf1 to bufn can be formed by using the source follower formed of the transistor M1 and the current source $I_B$ as shown in FIG. 2, for example.

FIG. 8 shows a structure obtained by performing parallelization (time-interleaving) on the structure of FIG. 1, and the time-interleaving can be similarly performed on the structure of FIG. 6

The operation of the A/D conversion circuit of FIG. 8 will be explained using the timing chart of FIG. 9.

Figure 9:
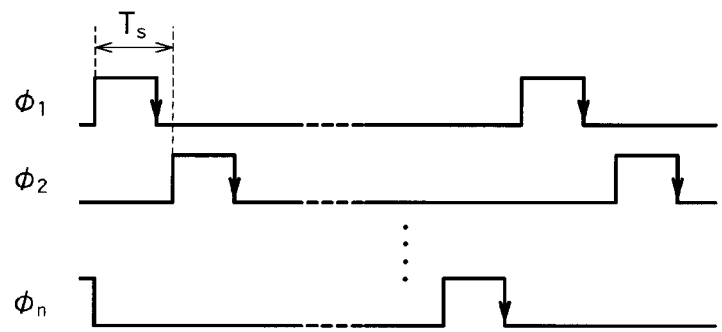
FIG. 9 is a diagram explaining the operation of the A/D conversion circuit of FIG. 8.

The timing chart of FIG. 9 shows the timing of the sampling clock φi for turning on/off the sampling switch Swi1 (i=1 to n) in each channel.

The sampling clock φi (i=1 to n) has a frequency of fs/n and an approximate duty ratio defied as on:off=1:n−1 (the length ratio of the off period to the on period is equal to or smaller than n−1). The phases of the sampling clocks φi are shifted from each other by (360/n)*(i−1) degrees. That is, the phases of the sampling clocks φ1 to φn are shifted from each other by 360/n. The sampling clocks φi (i=1 to n) are set so that the on periods are not overlapped (non-overlap). Here, fs shows the sampling frequency for the A/D conversion. Further, sampling cycle Ts is 1/fs. n shows the number of channels as stated above.

In each channel, the phase relationship among reset clocks φir of reset switches Swri1 and Swri2 and sampling clock φi is the same as the relationship shown FIG. 4. Also, in each channel, the phase relationship among sampling clock φis of sampling switch Swig in sub-ADCi and sampling clock φi is the same as the relationship shown FIG. 4. Note that how to supply the clocks for turn on the reset switches Swri1 and Swri2 is different from the first embodiment. This is a great characteristic in this structure.

In the present embodiment, the sampling clock φi is alternatively used as a reset clock (pulse) for turning on the reset switches Swri1 and Swri2. In the example of FIG. 9, The sampling clock φn of a sampling switch Swn1 in the channel n is alternatively used as the reset clocks of reset switches Swr11 and Swr12 in channel 1.

More concretely, sampling clock φj, which is any one of sampling clocks φ1 to φn excepting φi (in other words, i≠j, and i, j=1 to n), is used as the reset clock in i channel. In this case, it is desirable to define a relationship in which i+1 corresponds to j+1, and i=n+1 or j=n+1 correspond to i=1 and j=1 respectively.

In other words, it is desirable to turn on and off the reset switches Swri1 and Swri2 in channel i (i=1 to n) in accordance with a sampling clock for the channel i+A when i+A≦n, and in accordance with a sampling clock for the channel i+A−n when i+A>n, wherein A is a constant A which is equal to or greater than 1 and equal to or smaller than n−1 in order. In the example of FIG. 9, A is n−1.

In other words, it is desirable that the clocks φ1 to φn gives same intervals between sampling and reset in each channel. The reason for this requirement will be explained below.

First, when sampling (tracking) is performed by the sampling switches Sw11 to Swn1, switching-off (sampling) must be performed at regular time intervals, and thus sampling is sequentially performed by the sampling clocks φ1 to φn as shown in FIG. 9.

Considering the timing of sampling at sampling switches Sw12 to Swn2 of sub-ADC1 to sub-ADCn, clocks having the same interval must be used also in this case.

Note that, as will be understood from FIG. 7, sampling (φs) in the sub-ADC must be performed at the timing before reset (φr).

Accordingly, when a period (i.e., hold period) from the sampling timing of the sampling switches Sw11 to Swn1 toward reset timing of the sampling switches Swr12 to Swrn2 in each channel is not regularly, the sampling interval of the sub-ADC is constrained by the shortest hold period, which is because the sampling interval of the sub-ADC1 to sub-ADCn must be constant.

Therefore, in a channel having a hold period longer than the above hold period, the output voltage Vo1 to Von of the T/H circuit is wastefully retained after sampling is performed by the sub-ADC.

This means that the buffer circuit buf (circuit formed of the transistor M1 and the current source $I_B$ in FIG. 2, for example) continuously passes useless bias current, which leads to waste of electric power.

Accordingly, it is desirable that the clocks φ1 to φn gives the same intervals between sampling and reset in each channel.

The example shown in the present embodiment is obtained by performing time-interleaving on the structure of FIG. 1, and the clock phase relationship of FIG. 9 is also effective in a case where time-interleaving is performed on the structure of FIG. 2 or FIG. 6.

As stated above, according to the present embodiment, by performing time-interleaving on the structure shown in the first embodiment, high-speed operation can be realized with low power consumption. Further, since the sampling clocks φ1 to φn are reused to supply a reset pulse, there is no need to arrange reset clocks separately. Accordingly, complication of the clock generator can be prevented.

(Fourth Embodiment)

Figure 10:
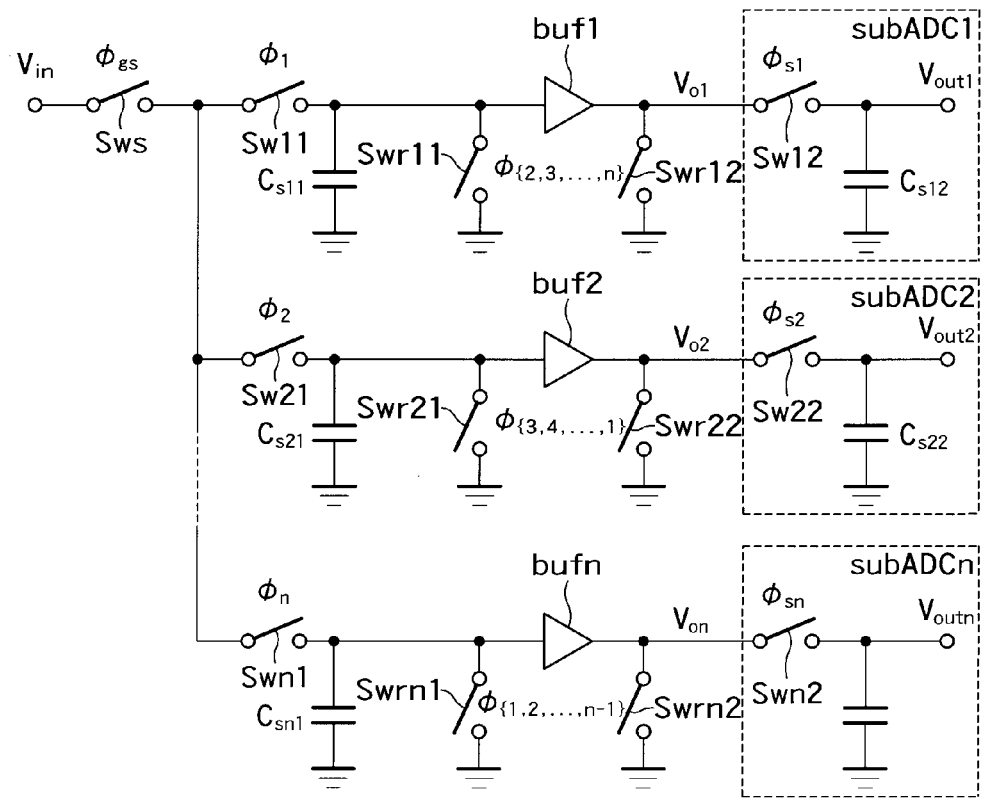
FIG. 10 is a diagram showing an A/D conversion circuit according to a fourth embodiment.

FIG. 10 shows an A/D conversion circuit according to a fourth embodiment.

The A/D conversion circuit of FIG. 10 is formed by additionally arranging a common switch (global sampling switch) Sws in the former stage of the input terminal Vin of FIG. 8. Hereinafter, differences from the third embodiment will be mainly explained, and overlapping explanation will be omitted.

One end of the global sampling switch Sws is connected to the Vin terminal, and the other end thereof is commonly connected to one end of the sampling switch Swi1 (i=1 to n) in each channel. The global sampling switch Sws is turned on/off depending on a clock (global sampling clock) φgs from an external clock generator.

Figure 11:
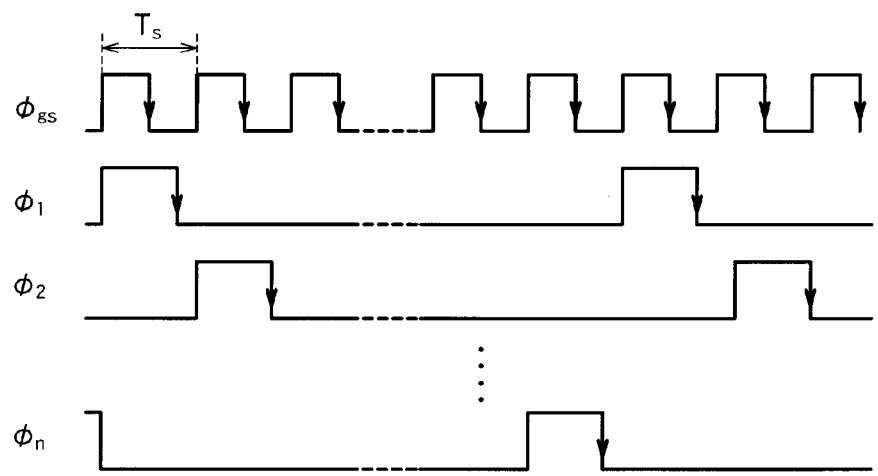
FIG. 11 is a diagram explaining the operation of the A/D conversion circuit of FIG. 10.

FIG. 11 shows the phase relationship among the global sampling clock φgs and the sampling clocks φ1 to φn.

The global sampling switch Sws performs sampling at the highest speed, in other words, directly at the A/D conversion speed fs (that is, with sampling interval Ts). The sampling clock φi has a frequency of 1/(Ts×n). The length of the on period (rising period) of the sampling clock φi is shorter than the cycle Ts of the global sampling clock φgs and longer than ½ of the cycle Ts.

In this way, sampling timing in each channel is determined by the falling timing of the global sampling clock φgs.

Explanation will be made on channel 1, for example. In this case, since the global sampling clock φgs falls before the sampling clock φ1 falls, the input voltage Vin does not pass through the switch Sw11 at point when the global sampling switch Sws is turned off even if the sampling switch Sw11 is turned on. That is, sampling is determined at the timing when the global sampling clock φgs falls.

The timing of the reset switches Swri1 and Swri2 (i=1 to n) and the sampling switch Swig in each channel is determined similarly to the third embodiment, the sampling clock φi in each channel being set as a starting point. Further, similarly to the third embodiment, a sampling clock in another channel may be alternatively used as the reset clocks of the reset switches Swri1 and Swri2 (i=1 to n) in each channel.

As stated above, according to the present embodiment, by arranging the global sampling switch Sws, sampling timing can be determined by this one component and error between channels due to clock skew can be reduced.

Further, according to the present embodiment, on-resistance of the global sampling switch Sws can be reduced, which realizes high-speed operation as a result. Hereinafter, this will be explained in detail.

In this structure, the reset switch Swri1 and Swri2 perform reset before track/hold operation is performed, and thus the overdrive voltage of the transistor in the buffer circuit bufi must be reduced to realize high-speed operation.

That is, current consumed in the T/H circuit is determined by dynamic current flowing through the transistor M1 (see FIG. 2) for charging the sampling capacitor Cs2 etc. of the sub-ADC. In this case, the magnitude of the current source $I_B$ is not related to a desired settling time determined by sampling frequency fs (since slew is not caused), and as the sampling capacitor Cs2 can be charged more efficiently as the current source $I_B$ becomes smaller (the current source $I_B$ functions only to reduce leak from the transistor M1). On the other hand, in order to charge the sampling capacitor Cs2 at high speed, transfer conductance K of the transistor M1 must be increased. Since the above overdrive voltage Vov is in proportion to $I_B/K$, the overdrive voltage Vov is required to be smaller and smaller to realize high-speed operation with low power consumption.

As stated above, by reducing the overdrive voltage of the transistor in the buffer circuit bufi, input bias voltage (or input common-mode voltage in a differential structure) can be set low, and on-resistance of the global sampling switch Sws can be reduced, by which high-speed operation can be realized as a result.

(Fifth Embodiment)

Figure 12:
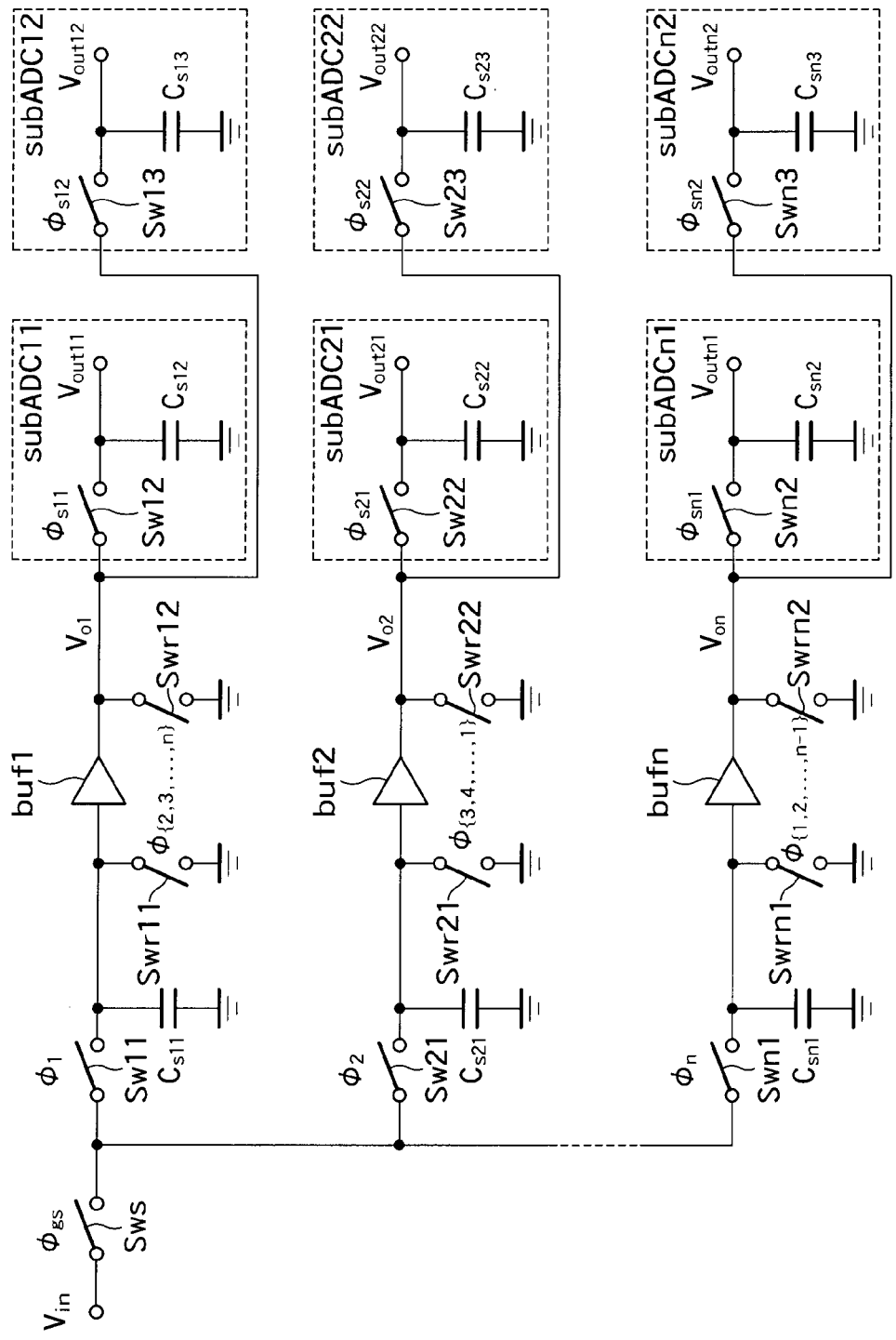
FIG. 12 is a diagram showing an A/D conversion circuit according to a fifth embodiment.

FIG. 12 shows an A/D conversion circuit according to a fifth embodiment.

The A/D conversion circuit of FIG. 12 is a TI-A/D conversion circuit when double sampling is performed in each channel of FIG. 10. Hereinafter, differences from the fourth embodiment will be mainly explained, and overlapping explanation will be omitted.

Concretely, two sub-ADCs (double sampling ADCs) are arranged in i (i=1 to n)-th channel.

One of the two sub-ADCs is a sub-ADCi1 formed of: a sampling switch Swi2 (φsi1); a sampling capacitor Csi2; a Vouti1 terminal; and a converter (first converter). The other is a sub-ADCi2 formed of: a sampling switch Swi3 (φsi2); a sampling capacitor Csi3; a Vouti2 terminal; and a converter (second converter).

The input of the sub-ADCi1 and that of the sub-ADCi2 are commonly connected to an output terminal Voi of the buffer circuit bufi. In the sub-ADCi1, the sampling switch Swi2 corresponds to a second sampling switch, and the sampling capacitor Csi2 corresponds to a second sampling capacitor. Further, in the sub-ADCi2, the sampling switch Swi3 corresponds to a third sampling switch, and the sampling capacitor Csi3 corresponds to a third sampling capacitor.

The sampling switch Swi2 of the sub-ADCi1 is turned on/off depending on a clock (second sampling clock) φsi1 from a clock generator. The sampling switch Swi3 of the sub-ADCi2 is turned on/off depending on a clock (third sampling clock) φsi2 from a clock generator.

Figure 13:
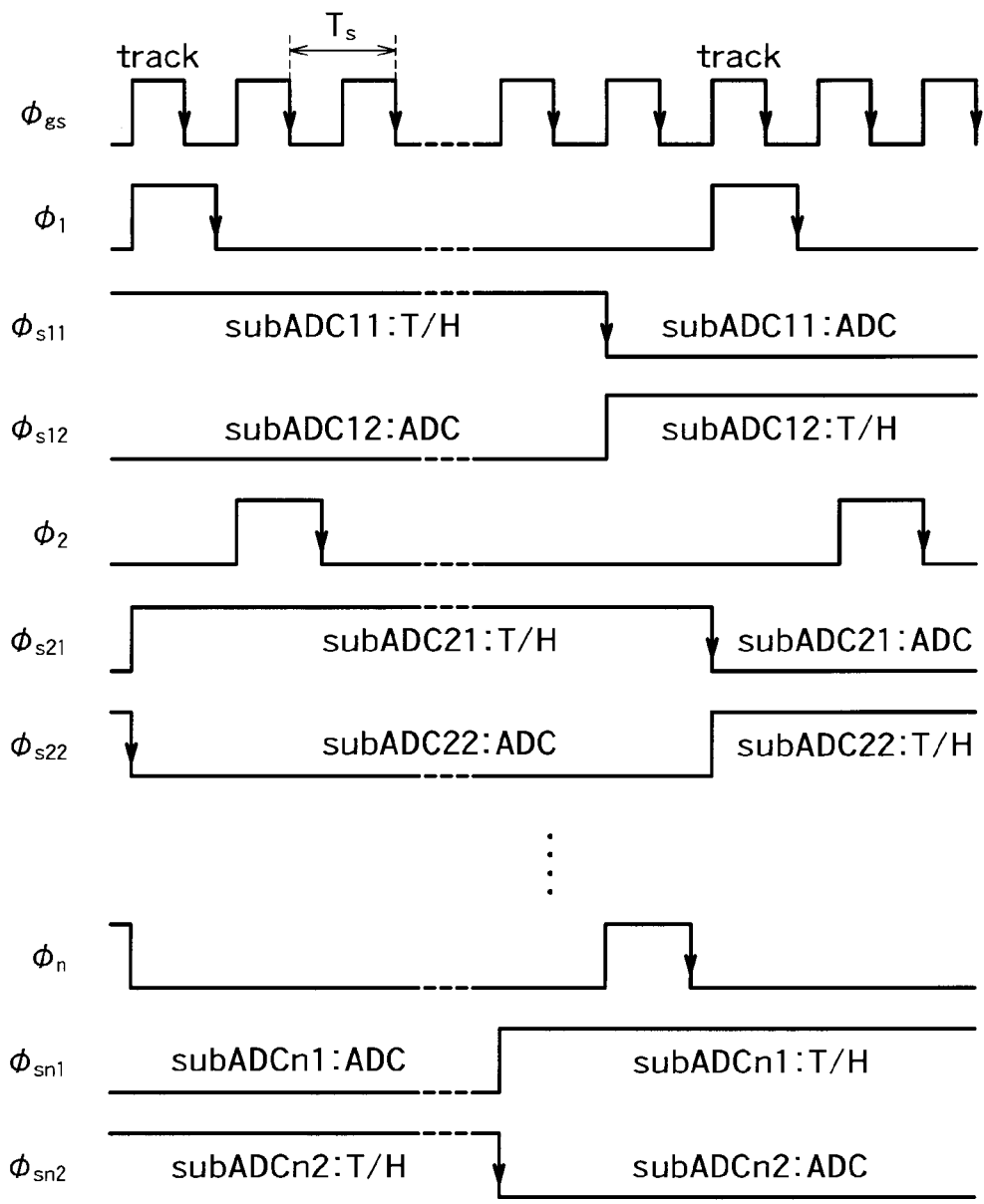
FIG. 13 is a diagram explaining the operation of the A/D conversion circuit of FIG. 12.

FIG. 13 shows a timing chart of the global sampling clock φgs, the sampling clock (first sampling clock) φi, the sampling clock (second sampling clock) φsi1, and the sampling clock (third sampling clock) φsi2.

In each channel, the sampling clocks φsi1 and φsi2 of the sampling switches Swi2 and Swi3 in the two sub-ADCs are reverse to each other.

That is, in each channel, when reset (A/D conversion) is performed in one of the two sub-ADCs, sampling is performed in the other sub-ADC. Accordingly, hold period and A/D conversion period can be sufficiently secured in the two sub-ADCs.

Note that, the phase relationship of FIG. 13 is based on an example where the sampling clock φn is used as a reset clock for the reset switches Swr11 and Swr12 of the T/H circuit in channel 1.

In the example, the sampling capacitor Cs13 of the sub-ADC 12 is reset when the sampling clock φn rises, and sampling of the sampling capacitor Cs13 is started when the sampling clock φ1 and the global sampling clock φgs rise after the sampling clock φn falls.

In the fourth embodiment, generally, when a clock φn in n-channel is alternatively used as a clock for the reset switches Swr11 and Swr12 in channel 1, the longest hold period can be obtained, and thus the buffer circuit buf1 is not required to have sufficient drive power and power consumption can be reduced.

Note that, in this case, the next track phase is immediately started. For example, in the fourth embodiment, it is impossible to obtain sufficient time to perform A/D conversion on the voltage signal held for a long time.

Accordingly, in the present embodiment, another sampling function is added to the fourth embodiment to alternately perform sampling and A/D conversion, by which hold period and A/D conversion period can be sufficiently secured and high-speed A/D converter can be realized with low power consumption.

(Sixth Embodiment)

Figure 14:
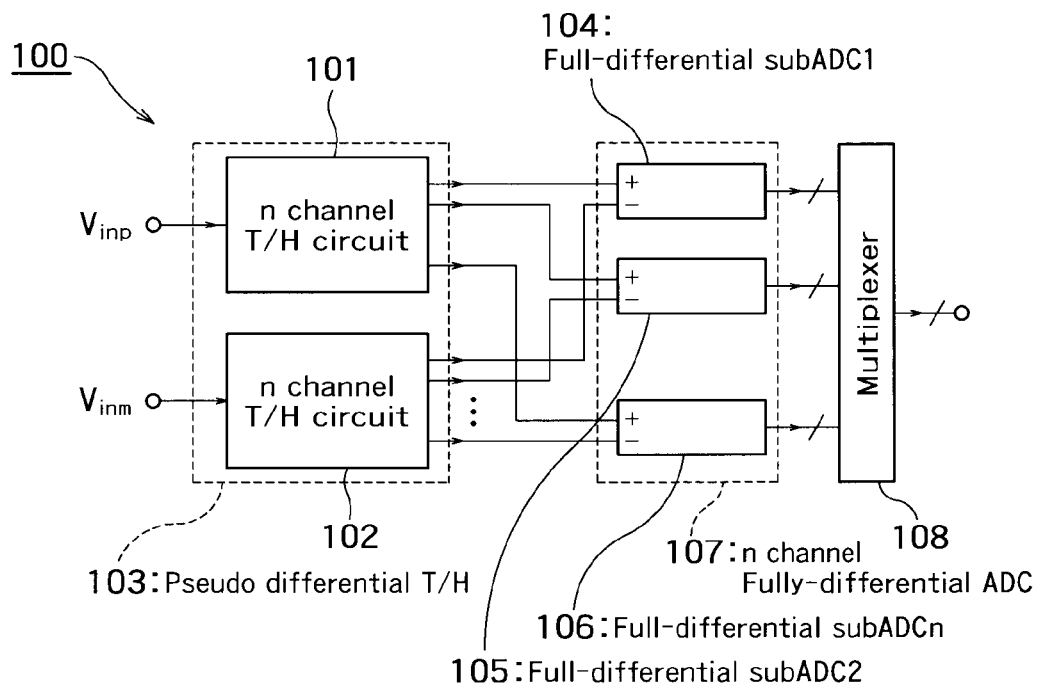
FIG. 14 is a diagram showing a fully differential time-interleaved A/D conversion circuit according to a sixth embodiment.

FIG. 14 shows an A/D conversion circuit according to a sixth embodiment.

In FIG. 14, an A/D conversion circuit 100 includes: a pseudo differential T/H circuit 103; a fully differential A/D converters (sub-ADCn) 107; and a multiplexer (MUX) 108.

The pseudo differential T/H circuit 103 is formed by using two n-channel T/H circuits (101 and 102) each including n-channel T/H circuits (single-end T/H circuits). n channels of the circuit 101 correspond to first channels 1 to n, and n channels of the circuit 102 correspond to second channels 1 to n.

When n is 1, each of the n-channel T/H circuits 101 and 102 includes one T/H circuit shown in FIG. 1, FIG. 2, or FIG. 6. When n is 2 or greater, each of the n-channel T/H circuits 101 and 102 includes the T/H circuits for 2 or more channels, as shown in FIG. 8, FIG. 10, or FIG. 12. When using the T/H circuits shown in FIG. 8, FIG. 10, or FIG. 12, each of the n-channel T/H circuits 101 and 102 is regarded as a TI-type T/H circuit.

Note that when employing the structure of FIG. 10 or FIG. 12, first and second global sampling switches are further arranged on the input side of the circuits 101 and 102. One end of the first global sampling switch is connected to a Vinp terminal, and the other end of the first global sampling switch is connected to one end of the sampling switch Swi1 (i=1 to n) in each channel of the circuit 101. Further, one end of the second global sampling switch is connected to a Vinm terminal, and the other end of the second global sampling switch is connected to one end of the sampling switch Swi1 (i=1 to n) in each channel of the circuit 102.

The two T/H circuits 101 and 102 receive differential input voltages Vinp(+) and Vinm(−), which are reverse to each other, through the Vinp terminal and the Vinm terminal respectively. Each of the two T/H circuits 101 and 102 outputs n tracked/held voltages (buffer voltages).

Here, the output voltage in channel 1 of the T/H circuit 101 is outputted to the plus terminal of a fully-differential sub-ADC 1(104), and the output voltage in channel 1 of the T/H circuit 102 is outputted to the minus terminal of the fully-differential sub-ADC 1(104).

The output voltage in channel 2 the T/H circuit 101 is outputted to the plus terminal of a fully-differential sub-ADC 2 (105), and the output voltage in channel 2 of the T/H circuit 102 is outputted to the minus terminal of the fully-differential sub-ADC 2(105).

Output from the T/H circuits 101 and 102 is similarly performed until up to channel n.

The fully-differential A/D converter 107 includes fully-differential sub-ADCs 1 to sub-ADCn corresponding to n channels.

Each of the fully-differential sub-ADCs 1 to sub-ADCn includes two ADCs (when n is 1) shown in FIG. 1, FIG. 2, or FIG. 6, or includes two sub-ADCs (when n is 2 or greater) shown in FIG. 8, FIG. 10, or FIG. 12.

Each of the fully-differential sub-ADCs 1 to sub-ADCn performs A/D conversion on the differential voltage (composite voltage) obtained from the outputs of the sampling capacitors of these two ADCs or sub-ADCs. Converters included in the fully-differential sub-ADCs 1 to sub-ADCn correspond to converters 1 to n respectively.

In other words, the plus terminal of the fully-differential sub-ADC 1 receives the output voltage in channel 1 of the n-channel T/H circuit 101, and the minus terminal thereof receives the output voltage in channel 1 of the n-channel T/H circuit 102. Output voltages received by the plus terminal and the minus terminal are sampled by the sampling capacitors Cs2 corresponding thereto, and differential voltage (composite voltage) of each sample/hold voltage is obtained through a common-mode node. The converter 1 performs A/D conversion on the acquired voltage to obtain a digital output. The digital output may be 1 bit or greater depending on the structure of the fully-differential sub-ADC 1.

Similarly, the plus terminals of the fully-differential sub-ADC 2 to sub-ADCn receive the output voltages in channels 2 to n of the n-channel T/H circuit 101, and the minus terminals thereof receive the output voltages in channels 2 to n of the n-channel T/H circuit 102. Output voltages received by the plus terminal and the minus terminal are sampled by the sampling capacitors Cs2 corresponding thereto, and differential voltage (composite voltage) of each sample/hold voltage is obtained through a common-mode node. The converters 2 to n perform A/D conversion on the acquired voltages to obtain digital outputs.

Note that when using a double sampling type sub-ADC shown in the fifth embodiment (see FIG. 12), each of two sub-ADCs used in the fully-differential sub-ADC i (i=1 to n) is a double sampling ADC.

The multiplexer (MUX) 108 is arranged in the latter stage of the fully-differential A/D converter 107. The multiplexer (MUX) 108 performs parallel-serial conversion (multiplexes) on n digital outputs from the fully-differential sub-ADCs 1 to sub-ADCn, in accordance with the clock frequency fs of the A/D conversion circuit. The digital output obtained by performing parallel-serial conversion can be obtained as a desired output.

As stated above, according to the present embodiment, the A/D conversion circuit has a differential structure, and thus common-mode rejection ratio (CMRR) can be increased and common-mode noises can be reduced.

(Seventh Embodiment)

Figure 15:
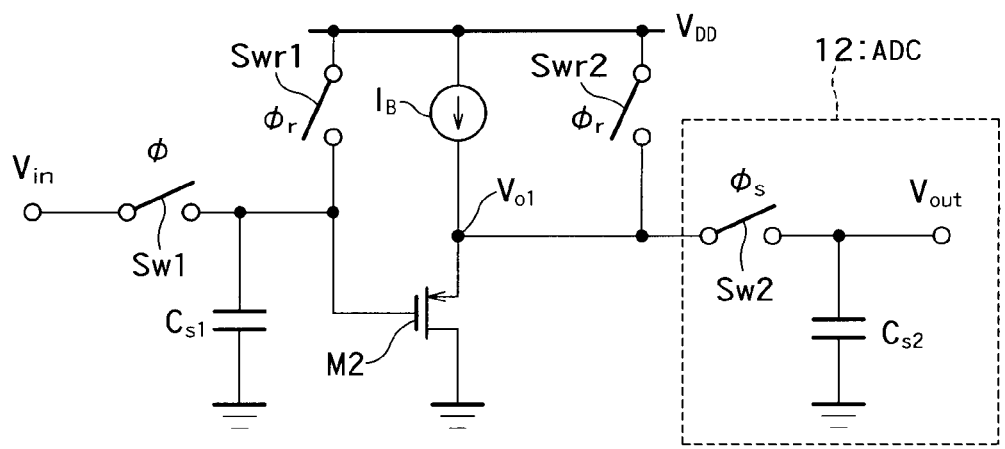
FIG. 15 is a diagram showing another concrete example of the buffer circuit in the A/D conversion circuit of FIG. 1.

FIG. 15 shows an A/D conversion circuit according to a seventh embodiment.

The A/D conversion circuit of FIG. 15 characterized in using a PMOS transistor M2 instead of the NMOS transistor M1 of the A/D conversion circuit shown in FIG. 2 in the first embodiment.

By using the PMOS transistor M2, one end of the reset switch Swr1 and one end of the reset switch Swr2 are connected to the power supply voltage $V_{DD}$ instead of the ground.

Further, the input of the current source $I_B$ is connected to the power supply voltage $V_{DD}$, and the output thereof is connected to the buffer output terminal Vo1.

The drain terminal of the PMOS transistor M2 is connected to the ground, and the source terminal thereof is connected to the buffer output terminal Vo1.

The sampling capacitor Cs1 and ADC function similarly to the first embodiment.

In this embodiment, a modification example of the first embodiment is shown, and it is also possible to similarly use a PMOS transistor instead of an NMOS transistor in the second to sixth embodiments.

(Eighth Embodiment)

Figure 16:
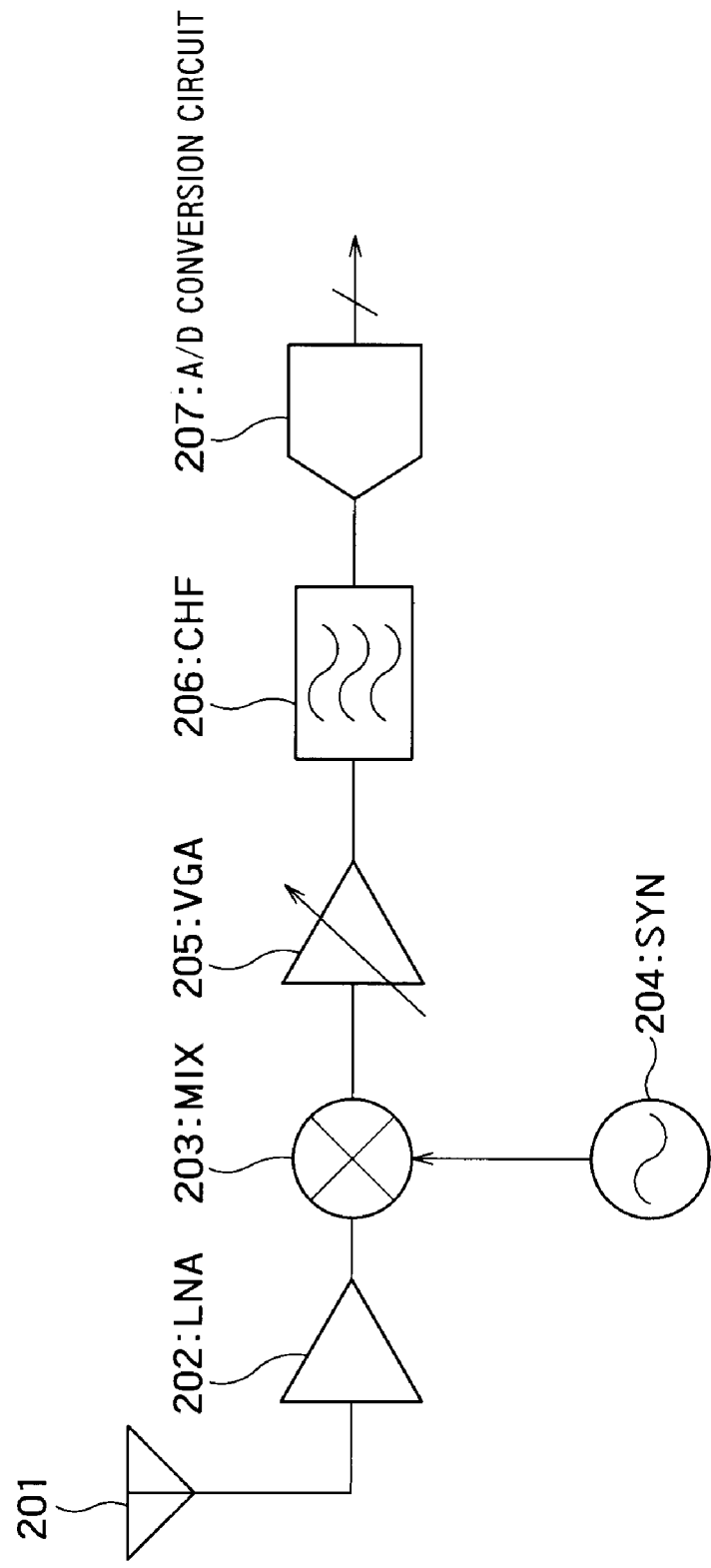
FIG. 16 is a diagram showing the structure of a receiver according to a seventh embodiment.

FIG. 16 shows a receiver having an A/D conversion circuit according to any one of the first to seventh embodiments.

This receiver includes: a/an antenna 201; a low noise amplifier (LNA) 202; a mixer (MIX) 203; a synthesizer (SYN) 204; a variable gain amplifier (VGA) 205; a channel select filter (CHF) 206; and an A/D conversion circuit 207. The A/D conversion circuit 207 is any one of A/D conversion circuits according to the first to seventh embodiments.

The antenna 201 receives a radio frequency (RF) signal, and inputs the RF signal into the low noise amplifier 202.

The LNA 202 amplifies the RF signal from the antenna 201, and inputs the amplified RF signal into the MIX 203.

The SYN 204 generates a local signal to down-convert the RF signal, and inputs the local signal into the MIX 203.

The MIX 203 multiplies the local signal from the SYN 204 to down-convert the RF signal from the LNA 202.

The VGA 205 adjusts the gain of the down-converted signal.

The CHF 206 extracts a signal in a desired frequency band from the signal whose gain is adjusted by the VGA 205.

The A/D conversion circuit 207 performs analog-digital conversion on the extracted signal in a desired frequency band to acquire digital data. The A/D conversion circuit 207 outputs the acquired digital data.

As stated above, according to the present embodiment, by using an A/D conversion circuit operating at very high speed and having a broad effective signal band, the bandwidth applied to communication can be similarly broadened and thus wireless communication can be performed at higher data rate.

Embodiments of the present invention is not limited to the exact embodiments described above and can be embodied with its components modified in an implementation phase without departing from the scope of the invention. Also, arbitrary combinations of the components disclosed in the above-described embodiments can form various inventions. For example, some of the all components shown in the embodiments may be omitted. Furthermore, components from different embodiments may be combined as appropriate.

The invention claimed is:

1. An A/D conversion circuit comprising:
    an input terminal configured to receive an input analog voltage;
    a first sampling capacitor configured to have one end connected to a first power source;
    a first sampling switch configured to have one end electrically connected to the input terminal and an other end electrically connected to an other end of the first sampling capacitor to control connection and disconnection between the input terminal and the other end of the first sampling capacitor in accordance with a first sampling clock, the connection being performed to track the input analog voltage to the first sampling capacitor and the disconnection being performed to hold a voltage of the first sampling capacitor;
    a buffer circuit configured to have a buffer input terminal electrically connected to the other end of the first sampling capacitor and a buffer output terminal, the buffer circuit operating between the first power source and a second power source so that a track/hold voltage, which is the voltage of the first sampling capacitor, received by the buffer input terminal is buffered and outputted from the buffer output terminal;
    a second sampling capacitor configured to have one end connected to the first power source;
    a second sampling switch configured to have one end electrically connected to the buffer output terminal of the buffer circuit and the other end electrically connected to an other end of the second sampling capacitor to control connection and disconnection between the buffer output terminal and the other end of an second sampling capacitor in accordance with a second sampling clock, the connection being performed to sample a voltage of the buffer output terminal to the second sampling capacitor and the disconnection being performed to hold a voltage of the second sampling capacitor;

a first converter configured to read a sample/hold voltage, which is the voltage of the second sampling capacitor after being held, and convert the sample/hold voltage into a digital signal;

a first reset switch configured to reset the first sampling capacitor by short-circuiting the other end of the first sampling capacitor to the first power source or the second power source in a period after the voltage of the second sampling capacitor is held and before the connection is performed by the first sampling switch; and a second reset switch configured to reset the second sampling capacitor by short-circuiting the other end of the second sampling capacitor to the first power source or the second power source in a period after the conversion by the first converter is performed and before the connection is performed by the first sampling switch.

2. The circuit of claim 1, wherein a track phase, a hold phase, an A/D conversion phase and a reset phase are sequentially performed in one cycle of the first sampling clock, wherein in the track phase, the voltage of the other end of the first sampling capacitor is tracked to the input analog voltage received by the input terminal via the first sampling switch and the voltage of the buffer output terminal is sampled to the second sampling capacitor by the second sampling switch;

in the hold phase, the voltage of the first sampling capacitor and the voltage of the second sampling capacitor are held, respectively;

in the A/D conversion phase, the first converter subsequently reads and converts the sample/hold voltage from the second sampling capacitor to into a digital signal after the hold phase; and in the reset phase, the first and second reset switches reset the first and second sampling capacitors after the A/D conversion phase is performed.

3. The circuit of claim 1, further comprising:

channels 1 to n each including: the first sampling capacitor; the first sampling switch; the buffer circuit; the second sampling capacitor; the second reset switch; the first converter; the first reset switch; and the second sampling switch, wherein one ends of the first sampling switches of the channels 1 to n are commonly connected to the input terminal.

4. The circuit of claim 3, wherein the first sampling switches of the channels 1 to n are turned on to perform the connection and turned off to perform the disconnection in accordance with first sampling clocks $\phi 1$ to $\phi n$ having same cycle and having phases shifted from each other by 360/n, a length ratio of an off period to an on period being equal to or smaller than n−1, wherein the first and second reset switches of a channel i (i=1 to n) is turned on and off in accordance with the first sampling clock of a channel i+A when i+A≦n and in accordance with the first sampling clock of a channel i+A−n when i+A>n, and is performed when the first and second reset switches are turned on and released when the first and second reset switches are turned off, wherein A is a constant which is equal to or greater than 1 and equal to or smaller than n−1, wherein the second sampling switches of the channels 1 to n are turned on to perform the connection and turned off to perform the disconnection in accordance with second sampling clocks $\phi s1$ to $\phi sn$ having same phase relationship as that of the first sampling clocks $\phi 1$ to $\phi n$.

5. The circuit of claim 4, wherein a track phase, a hold phase, an A/D conversion phase and a reset phase are sequentially performed in the channels 1 to n with the phases being shifted from each other by 1/n of the cycle of the first sampling clock $\phi 1$:

in the track phase, the first and second sampling switches are turned on to track the input analog voltage received by the input terminal to the first sampling capacitor and to sample the voltage of the buffer output terminal to the second sampling capacitor;

in the hold phase, the first sampling switch is turned off to hold the voltage of the first sampling capacitor;

in the A/D conversion phase, the second sampling switch is turned off to hold the voltage of the second sampling capacitor and the first converter subsequently reads and converts the sample/hold voltage of the second sampling capacitor into a digital signal; and in the reset phase, the first and second reset switches are turned on to reset the first and second sampling capacitors and the first and second reset switches are turned off to release the reset, after the A/D conversion phase is performed.

6. The circuit of claim 1, further comprising:

channels 1 to n each including: the first sampling capacitor; the first sampling switch; the buffer circuit; the second sampling capacitor; the second reset switch; the first converter; the first reset switch; and the second sampling switch; and a global sampling switch having one end and an other end, wherein one end of the global sampling switch is connected to the input terminal, and one ends of the first sampling switches of the channels 1 to n are commonly connected to the other end of the global sampling switch.

7. The circuit of claim 6, wherein the global sampling switch is repeatedly turned on and off at regular intervals, in accordance with a global sampling clock $\phi gs$ having a cycle Ts, to transmit the input analog voltage to one end of each of the first sampling switches when being turned on and to stop the transmission of the input analog voltage when being turned off, wherein the first sampling switches of the channels 1 to n are turned on to perform the connection and turned off to perform the disconnection in accordance with first sampling clocks $\phi 1$ to $\phi n$ having a frequency of 1/(Ts×n) and having phases shifted from each other by 360/n, the length of an on period in one cycle being shorter than the length of the cycle Ts of the global sampling clock $\phi gs$ and longer than ½ of the length of the cycle Ts, and the on period of the global sampling clock $\phi gs$ and that of each of the first sampling clocks $\phi 1$ to $\phi n$ starting nearly correspondently, wherein the first and second reset switches of a channel i (i=1 to n) are turned on and off in accordance with the first sampling clocks $\phi 1$ to $\phi n$ of a channel i+A when i+A≦n and in accordance with the first sampling clock of a channel i+A−n when i+A>n wherein A is a constant which is equal to or greater than 1 and equal to or smaller than n−1, and wherein the second sampling switches of the channels 1 to n are turned on to perform the connection and turned off to perform the disconnection in accordance with second sampling clocks φs1 to φsn having same phase relationship as that of the first sampling clocks φ1 to φn.

8. The circuit of claim 7, wherein a track phase, a hold phase, an A/D conversion phase and a reset phase are sequentially performed in the channels 1 to n with the phases being shifted from each other by the cycle Ts of the global sampling clock φgs:
   in the track phase, the first and second sampling switches are turned on to track the input analog voltage received by the input terminal to the first sampling capacitor and to sample the voltage of the buffer output terminal to the second sampling capacitor;
   in the hold phase, the first sampling switch is turned off to hold the voltage of the first sampling capacitor;
   in the A/D conversion phase, the second sampling switch is turned off to hold the voltage of the second sampling capacitor and the first converter subsequently reads and converts the sample/hold voltage of the second sampling capacitor into a digital signal; and
   in the reset phase, the first and second reset switches are turned on to reset the first and second sampling capacitors and the first and second reset switches are turned off to release the reset, after the A/D conversion phase is performed.

9. The circuit of claim 1, further comprising:
   channels 1 to n each including: the first sampling capacitor; the first sampling switch; the buffer circuit; the second sampling capacitor; the second reset switch; the first converter; the first reset switch; and the second sampling switch; and
   a global sampling switch having one end and an other end, wherein one end of the global sampling switch is connected to the input terminal, and one ends of the first sampling switches of the channels 1 to n are commonly connected to the other end of the global sampling switch,
   wherein each of the channels 1 to n includes:
   a third sampling capacitor configured to have one end connected to the first power source;
   a third sampling switch configured to have one end electrically connected to the buffer output terminal of the buffer circuit and an other end electrically connected to an other end of the third sampling capacitor to control connection and disconnection between the buffer output terminal and the other end of the third sampling capacitor in accordance with a third sampling clock, the connection being performed to sample a voltage of the buffer output terminal to the third sampling capacitor and the disconnection being performed to hold a voltage of the third sampling capacitor; and
   a second converter configured to read a sample/hold voltage, which is the voltage of the third sampling capacitor after being held, and convert the sample/hold voltage into a digital signal, and
   wherein the second reset switch of each of the channels 1 to n resets the third sampling capacitor by short-circuiting the other end of the third sampling capacitor to the first power source or the second power source in a period after the conversion by the second converter is performed and before the connection is performed by the first sampling switch.

10. The circuit of claim 9,
    wherein the global sampling switch is repeatedly turned on and off at regular intervals, in accordance with a global sampling clock φgs having a cycle Ts, to transmit the input analog voltage to one end of each of the first sampling switches when being turned on and to stop the transmission of the input analog voltage when being turned off,
    wherein the first sampling switches of the channels 1 to n are turned on to perform the connection and turned off to perform the disconnection in accordance with first sampling clocks φ1 to φn having a frequency of 1/(Ts×n) and having phases shifted from each other by 360/n, the length of an on period in one cycle being shorter than the length of the cycle Ts of the global sampling clock φgs and longer than ½ of the length of the cycle Ts, and the on period of the global sampling clock Dgs and that of each of the first sampling clocks φ1 to φn starting nearly correspondingly,
    wherein the first and second reset switches of a channel i (i=1 to n) are turned on and off in accordance with the first sampling clock of a channel i+A when i+A≦n and in accordance with the first sampling clock of a channel i+A−n when i+A>n, wherein A is a constant which is equal to or greater than 1 and equal to or smaller than n−1,
    wherein the second sampling switches of the channels 1 to n are turned on to perform the connection and turned off to perform the disconnection in accordance with second sampling clocks φs11, φs21, φs31, . . . , φsn1 having same phase relationship as that of the first sampling clocks φ1 to φn, and
    wherein the third sampling switches of the channels 1 to n are turned on to perform the connection and turned off to perform the disconnection in accordance with second sampling clocks φs12, φs22, φs32, . . . , φsn2 having same phase relationship as that of the first sampling clocks φ1 to φn.

11. The circuit of claim 10, wherein first-fourth phases are sequentially performed in the channels 1 to n with the phases being shifted from each other by the cycle Ts of the global sampling clock φgs:
    in the first phase, the first and second sampling switches are turned on and the third sampling switch is turned off to track the input analog voltage received by the input terminal to the first sampling capacitor, to sample the voltage of the buffer output terminal to the second sampling capacitor, and to convert the sample/hold voltage of the third sampling capacitor into a digital signal by the second converter;
    in the second phase, the first sampling switch is turned off and further the first and second reset switches are turned on to reset the first sampling capacitor and the third sampling capacitor, and the first and second reset switches are subsequently turned off to release the reset;
    in the third phase, the first and third sampling switches are turned on and the second sampling switch is turned off to track the input analog voltage received by the input terminal to the first sampling capacitor, to sample the voltage of the buffer output terminal to the third sampling capacitor, and to convert the sample/hold voltage of the second sampling capacitor into a digital signal by the first converter; and
    in the fourth phase, the first sampling switch is turned off and further the first and second reset switches are turned on to reset the first and second sampling capacitors, and the first and second reset switches are subsequently turned off to release the reset.

12. The circuit of claim 1, further comprising:
    first and second input terminals as the input terminal;

first channels 1 to n each including: the first sampling capacitor; the first sampling switch; the buffer circuit; the second sampling capacitor; the second reset switch; the first reset switch; and the second sampling switch;

second channels 1 to n each including: the first sampling capacitor; the first sampling switch; the buffer circuit; the second sampling capacitor; the second reset switch; the first reset switch; and the second sampling switch;

converters 1 to n as the converter; and a multiplexer, wherein the one ends of the first sampling switches of the first channels 1 to n are commonly connected to the first input terminal, wherein the one ends of the first sampling switches of the second channels 1 to n are commonly connected to the second input terminal, wherein the input analog voltage received by the first input terminal and the input analog voltage received by second input terminals are reverse to each other, wherein the converters 1 to n read the sample/hold voltages of the second sampling capacitors from the first channels 1 to n and the second channels 1 to n to convert differential voltages of the sample/hold voltages read from the first channels 1 to n and the second channels 1 to n into digital signals, and the multiplexer multiplexes the digital signals obtained from the converters 1 to n.

13. The circuit of claim 12, further comprising:

first and second global sampling switches each having one end and an other end, wherein one end of the first global sampling switch is connected to the first input terminal, and one ends of the first sampling switches of the first channels 1 to n are commonly connected to the other end of the global sampling switch, and wherein one end of the second global sampling switch is connected to the second input terminal, and one ends of the first sampling switches of the second channels 1 to n are commonly connected to the other end of the second global sampling switch.

14. The circuit of claim 1, wherein the buffer circuit includes:

a transistor having a gate terminal as the buffer input terminal, a drain terminal, and a source terminal; and a current source having one end and an other end, wherein the drain terminal of the transistor is connected to the second power source, wherein one end of the current source and the source terminal of the transistor are electrically connected to the buffer output terminal, and wherein the other end of the current source is connected to the first power source.

15. The circuit of claim 1, wherein the buffer circuit includes:

a transistor having a gate terminal as the buffer input terminal, a drain terminal, and a source terminal; and a current source having one end and an other end, wherein the drain terminal of the transistor is connected to the first power source, wherein the one end of the current source and the source terminal of the transistor are electrically connected to the buffer output terminal, and wherein the other end of the current source is connected to the second power source.

16. A receiver comprising:

an antenna configured to receive a wireless signal to generate an analog reception signal;

a mixer configured to down-convert the analog reception signal using a local signal;

a channel select filter configured to extract a signal of a desired frequency band from the down-converted signal; and an A/D conversion circuit of claim 1, which performs analog-digital conversion on the extracted signal.

* * * * *